United States Patent [19]

Kinsman et al.

[11] Patent Number: 5,177,055

[45] Date of Patent: Jan. 5, 1993

[54] PROCESS FOR THE PREPARATION OF SUPERCONDUCTOR PRECURSOR METAL OXIDE POWDERS COMPRISING SPRAYING A MIXED METAL SALT SOLUTION INTO A HORIZONTAL FURNACE

[75] Inventors: Barry E. Kinsman; Rodney Riddle, both of Poole; Anthony R. Wilson, Dorset, all of United Kingdom

[73] Assignee: Merck Patent Gesellschaft mit beschraenkter Haftung, Darmstadt, Fed. Rep. of Germany

[21] Appl. No.: 362,428

[22] Filed: Jun. 1, 1989

[30] Foreign Application Priority Data

Oct. 5, 1987 [GB] United Kingdom ............... 8723345

[51] Int. Cl.$^5$ ............................................. H01L 39/12
[52] U.S. Cl. ...................................... 505/1; 505/725; 505/733; 505/737; 505/780; 501/94; 501/123; 501/126; 252/518; 423/593
[58] Field of Search ................... 505/1, 725, 733, 737, 505/780; 423/593; 501/123, 126, 94; 252/518

[56] References Cited

U.S. PATENT DOCUMENTS

| | | | |
|---|---|---|---|
| 4,657,879 | 4/1987 | Nicholson et al. | 505/809 |
| 4,898,851 | 2/1990 | Michel | 505/1 |
| 4,908,346 | 3/1990 | Strom et al. | 505/1 |
| 4,985,400 | 1/1991 | Chaudhury | 505/1 |

OTHER PUBLICATIONS

Roy et al., "Preparation of Fine Oxide Powders by Evaporative Decomposition of Solutions", *Ceramic Bulletin*, vol. 56, No. 11 (1977).

Perry et al., *Perry's Chemical Engineers Handbook*, 6th edition, pp. 20-51 to 20-57, (1984).

Kawai et al., "Formation of Y-Ba-Cu-O Superconducting Film by a Spray Pyrolysis Method", J.J.A.P., vol. 26, No. 10, Oct., 1987, pp. L1740-L1742.

*Primary Examiner*—Paul Lieberman
*Assistant Examiner*—Bradley A. Swope
*Attorney, Agent, or Firm*—Millen, White, Zelano and Branigan

[57] ABSTRACT

Disclosed is a process for the preparation of multi-element metal oxide, high temperature superconductor precursor powder comprising spraying a homogenous solution of a multi-element metal salt solution mixed in a stoichiometric ratio corresponding to the desired superconducting composition into a horizontal tube-like furnace being heated to a temperature of 800°-1000° C., transporting resulting sprayed mist along the main axis of the furnace tube by the aid of hot air and collecting resultant finely divided metal oxide powder by the aid of a filter, whereby the resultant mixed metal oxide powder is a precursor for the preparation of a high temperature superconducting ceramic.

5 Claims, No Drawings

PROCESS FOR THE PREPARATION OF SUPERCONDUCTOR PRECURSOR METAL OXIDE POWDERS COMPRISING SPRAYING A MIXED METAL SALT SOLUTION INTO A HORIZONTAL FURNACE

BACKGROUND OF THE INVENTION

The present invention concerns a process for the preparation of multi-element metal oxide powders useful as precursors for the preparation of high-temperature superconducting ceramics.

Although the phenomenon of superconductivity is long known, it was just in the recent past that a major breakthrough was reached by the development of copper-containing mixed oxides which show extraordinarily high transition temperatures ($T_c$). Although these mixed oxides usually consist of the oxides of at least three metals, the superconductors form a single homogeneous phase. In the production of such a superconducting phase, therefore, care has to be taken that the starting materials, e.g. the single metal oxides, are intimately mixed, so that upon firing a uniform product can be obtained.

Thus, for example metal oxides or carbonates used as a starting material are mixed in the desired stoichiometric ratio and heated at a temperature of about 800° to 1000° C. for about 20 hours. The resulting material is then reground and heated again under similar conditions.

Other processes are described in Inorganic Chemistry 1987 (26), pp. 1474-1476, and are known as the carbonate, the citrate and the oxalate route. In these cases solutions of metal salts are prepared and the metals are precipitated as carbonates, citrates or oxalates which are then dried, powdered and heated, whereby the mixed oxide phase is formed.

All these processes require quite a number of steps until a relatively homogeneous metal oxide phase is obtained. Nevertheless, it cannot be assured that even very small particles possess the same homogeneousness as the product as a whole, if such very small particles can be obtained at all.

SUMMARY OF THE INVENTION

It was, therefore, the task of the present invention to provide a process by which in a very simple one-step process mixed metal oxides can be produced as a very fine powder and whereby even fine powder particles in the submicron range possess the same homogeneousness as the composition as a whole.

It has been found out that these objects can be met by a process which in principle is known as the so-called Evaporative Decomposition of Solutions (EDS-process) and that the so obtained very fine oxide powders are especially useful for the production of superconductive ceramics.

The object of the present invention is therefore a process for the preparation of multi-element metal oxide powders useful as precursors for the preparation of high-temperature superconducting ceramics, characterized by mixing metal salt solutions in the stoichiometric proportion required for the desired endproduct, spraying the homogeneous solution into a tube-like furnace being heated to a temperature of 800° to 1100° C., transporting the sprayed mist along the main axis of the furnace by the aid of hot air and collecting the finely divided metal oxide powder by the aid of a filter.

The main advantages of this process are that very fine grain powders are obtained which possess diameters of about 2 $\mu$m or even less which consist already of a mixed oxide phase instead of being mixtures of the single oxides. The fine powders are highly reactive and are therefore conducive to the formation of theoretically dense ceramics which are likely to show superior properties to less dense forms.

By the extremely intimate mixing of the constituents within the powder particles, a superconducting ceramic can be produced by direct pressing and sintering of the powder, i.e. without an initial ball-milling/sintering/regrinding process. Nevertheless, very uniform and homogeneous superconducting phases are formed within the processed ceramics.

These advantages of low particle size, high reactivity and intimate mixing are applicable not only to precursors for superconducting ceramics but are applicable in general to ceramic precursors of complex composition. The present invention is therefore not restricted to the preparation of precursors for superconductors. As an example it can be mentioned that also in the case of the formation of $CaO/La_2O_3$-mixtures a very intimate mixing is essential for the subsequent conversion to high-quality $CaS/La_2S_3$ powder used in hot pressing of IR optics.

The main application of the inventive process, however, regards the formation of copper oxide-containing mixed oxide phases for superconductors. As examples can be mentioned the general formulae $Y_{2-x}Ba_xCuO_4$, $La_{2-x}Ba_xCuO_{4-y}$, $La_{1-x}Ba_xCuO_{3-y}$, $La_{2-x}Sr_xCuO_4$ or $Y_{2-x}Ba_xCu_yO_z$ and especially the compositions $YBa_2Cu_3O_x$, $YBa_2Cu_3O_7$ and $Y_{1.2}Ba_{0.8}CuO_y$.

Preferred are therefore mixed oxides based on compositions which contain a rare earth metal, an alkaline earth metal and copper as a single phase oxide.

For the preparation of a homogeneous solution of the metal compounds any soluble salt can be used like e.g. the nitrates, acetates, formates, chlorides and citrates. Especially preferred are the nitrates. The metal salts are dissolved in enough water so that about 5 to 30 weight % solutions (based on all the metal compounds) are obtained, the molar composition of the solution reflecting the molar composition of the desired endproduct.

The aqueous solution is then sprayed via a suitable sprayhead into the furnace which is heated to a temperature of about 800° to 1100° C., preferably about 950° to 1000° C. Since the grain size of the resulting oxide powder is mainly determined by the spraying process, care is taken that the spraying equipment and the process parameters are chosen in a way that very fine droplets are formed. Those parameters are in principle known to the skilled worker and include the nozzle diameter of the sprayhead and the air pressure. Preferably a stainless steel sprayhead is used with a nozzle diameter of about 0.6 mm, the air being fed with a pressure of about 2.5 to 10 psi.

At the extremely high temperature in the furnace the small droplets lose water very rapidly and the remaining metal salts start to decompose. Nevertheless, complete decomposition and forming of the mixed oxide phase requires some time. To ascertain a residence time of the particles in the heated zone of the furnace which is sufficient for a complete decomposition, a considerable pathlength must be made available.

The usual construction of a furnace for EDS consists of a vertically placed heated tube with a spray nozzle at the top and a filter for collecting the product at the bottom of the tube. In this system the spray droplets and oxide particles move directly down the vertical furnace tube which must be of considerable length to ensure complete evaporation, decomposition and oxidation.

It has now been found, surprisingly, that by operating the furnace tube in a horizontal mode a significant improvement can be reached. Surprisingly, it is found that the spray particles progress through the furnace in a spiral manner. Without being bound to any theory it is presumed that the horizontal arrangement of the furnace tube leads to an advantageous convective airflow inside the furnace tube, causing the spray particles to spiral slowly along the tube.

This leads to an extended residence time in the furnace and hence the possibility of using a shorter furnace than would be required for complete decomposition/oxidation in a vertical arrangement. It is estimated that the furnace length of a horizontal EDS-system can be reduced to ½ to ⅓ that of a vertical system. In addition, the spiralling motion also prevents any major adherence of oxide powder to the furnace walls.

The layout of the equipment is of course dependent on the desired product outlet. For a construction which is able to deliver about 20-200 g of oxide powder/day a furnace length of about 1 m with a diameter of about 50 to 70 mm has been found sufficient.

Of course, the feed of raw materials and hot air has to be adapted to the dimensions of the furnace. For the above mentioned small sized reactor it has been found appropriate to use a stainless steel sprayhead which is fed with about 30 to 120 ml/hour of metal salt solution and with hot air of a pressure of about 5-7.5 psi. For a differently dimensioned equipment these values can change considerably but in any case the appropriate parameters can be easily found by some experiments the skilled worker is acquainted with.

The mixed oxides which are formed in the furnace can be easily collected at the end of the tube by passing the exhaust gas stream through an appropriate filter like e.g. a stainless steel filter. In view of the very small grain size of the oxide powder which is normally in a magnitude of about 1-2 $\mu$m but can be reduced by the use of optimized sprayheads to less than 1 $\mu$m, fine filters with a mesh size of about 0.3 to 20 $\mu$m are preferred.

The collected powder contains usually a certain degree of volatiles, especially water and nitrate and is therefore annealed in air for about 1 to 4 hours at a temperature of about 600° to 950° C. Thereafter, the product can be immediately compressed without further grinding to a compact which is then fired at a temperature of about 850° to 1200° C. to produce a dense ceramic body.

To produce a superconductor with an appropriate oxygen content this ceramic body is finally annealed in an oxygen atmosphere at about 400° to 600° C. The so produced very dense ceramics show superconductivity up to regions of about 90° K.

EXAMPLES

EXAMPLE 1

Preparation of $YBa_2Cu_3O_x$ powder 1.2 liters of an aqueous solution containing 28.8 g/l $Y(NO_3)_3.6H_2O$, 39.2 g/l $Ba(NO_3)_2$ and 54.5 g/l $Cu(NO_3).3H_2O$ were sprayed into the EDS reactor over a period of 24 hours. Spray was generated by a CT London ¼ J sprayhead with an air feed of 5-7.5 psi; the solution was delivered to the sprayhead by peristaltic pump. The EDS reactor, a 60 mm diameter, 1 m long horizontally placed silica tube was heated to 950°-1000° C. The resulting oxide powder was collected by passing the exhaust gas stream through a Pall stainless steel filter with a mesh size of 13 $\mu$m. Approximately 70 g of product was collected over a 24 hr period. TGA showed it contained approx. 10% volatile materials ($H_2O$, $NO_3$)

EXAMPLE 2

Preparation of $YBA_2Cu_3O_x$ superconductor $YBA_2Cu_3O_x$ powder was first baked in air at 700° C. for 4 hours to remove volatiles. It was then compressed to a "green body" at room temperature with isopropyl alcohol as binder. The compact was fired at 850°-950° in air to produce a dense ceramic body which was finally annealed in oxygen at 400°-600° C.

EXAMPLE 3

Preparation of $CaLa_2O_4$ powder 1.2 liters of aqueous solution containing 61.8 g/l $Ca(NO_3)_2.4H_2O$ and 226.8 g/l $La(NO_3)_3.6H_2O$ were sprayed into the EDS reactor over a period of 20 hours.

Spray was generated by CT London ¼ J sprayhead with an air feed of 5 psi; the solution was delivered to the sprayhead by peristaltic pump. The EDS reactor, a 60 mm diameter, 1 m long horizontally placed silica tube was heated to 950°-1000° C. The resulting oxide powder was collected by passing the exhaust gas stream through a Pall stainless steel filter with a mesh size of 13 $\mu$m. Approximately 90 g of product was collected over a 20 hr period. TGA showed it contained approx. 12% volatile materials ($H_2O$, $NO_3$).

We claim:

1. A process for the preparation of multi-element metal oxide high to superconductor precursor powder comprising spraying a homogeneous solution of a multi-element metal salt solution, mixed in a stoichiometric ratio corresponding to the desired superconducting composition, into a horizontal tube-like furnace being heated to a temperature of 800° to 1100° C., transporting resulting sprayed mist along the main axis of the furnace tube by the aid of hot air and collecting resultant finely divided mixed metal oxide powder by the aid of a filter, whereby the resultant metal oxide powder is a precursor for the preparation of a high-temperature superconducting ceramic.

2. A process according to claim 1, characterized in that as a metal salt solution, a homogeneous solution of a rare earth metal salt, an alkaline earth metal salt and a copper salt is used.

3. A process according to claim 1, wherein as the metal salts, the nitrate are used.

4. A process according to claim 2, wherein a metal salt solution containing an yttrium, a barium and a copper salt is used.

5. A process according to claim 2, wherein a metal salt solution containing strontium, lanthanum and copper salts is used.

* * * * *